United States Patent
Nagabhirava et al.

(10) Patent No.: US 10,002,773 B2
(45) Date of Patent: Jun. 19, 2018

(54) METHOD FOR SELECTIVELY ETCHING SILICON OXIDE WITH RESPECT TO AN ORGANIC MASK

(71) Applicant: Lam Research Corporation, Fremont, CA (US)

(72) Inventors: Bhaskar Nagabhirava, Cohoes, NY (US); Adarsh Basavalingappa, Albany, NY (US); Peng Wang, Clifton Park, NY (US); Prabhakara Gopaladasu, Fremont, CA (US); Michael Goss, Holliston, MA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/290,890

(22) Filed: Oct. 11, 2016

(65) Prior Publication Data

US 2018/0102257 A1 Apr. 12, 2018

(51) Int. Cl.
 *H01L 21/311* (2006.01)
(52) U.S. Cl.
 CPC .. *H01L 21/31144* (2013.01); *H01L 21/31116* (2013.01)
(58) Field of Classification Search
 CPC ................. H01L 21/31144; H01L 21/31116
 See application file for complete search history.

(56) References Cited

U.S. PATENT DOCUMENTS

| | | | |
|---|---|---|---|
| 6,919,746 B2 | 7/2005 | Hudson et al. | |
| 8,551,877 B2 | 10/2013 | Ranjan et al. | |
| 8,603,921 B2 * | 12/2013 | Shimizu | H01L 21/31116 257/E21.232 |
| 8,883,028 B2 | 11/2014 | Kanarik | |
| 9,011,631 B2 | 4/2015 | Panagopoulos | |
| 2004/0224520 A1 * | 11/2004 | Yun | H01L 21/31116 438/691 |
| 2008/0014761 A1 * | 1/2008 | Bhatia | H01L 21/0332 438/769 |
| 2014/0051256 A1 * | 2/2014 | Zhong | H01J 37/32706 438/717 |
| 2016/0293405 A1 * | 10/2016 | Matsumoto | G03F 7/20 |

* cited by examiner

*Primary Examiner* — Kyoung Lee
*Assistant Examiner* — Christina Sylvia
(74) *Attorney, Agent, or Firm* — Beyer Law Group LLP

(57) ABSTRACT

A method for selectively etching trenches in a silicon oxide containing layer with an organic planarization layer is provided. Processing the silicon oxide layer comprises a plurality of process cycles, wherein each etch cycle comprises a deposition phase, comprising providing a flow of a deposition phase gas comprising a fluorocarbon or hydrofluorocarbon containing gas with a fluorine to carbon ratio, providing a constant RF power, which forms the deposition phase gas into a plasma, and stopping the deposition phase and an etch phase, comprising providing a flow of an etch phase gas comprising a fluorocarbon or hydrofluorocarbon containing gas with a fluorine to carbon ratio that is higher than the fluorine to carbon ratio of the deposition phase gas, providing a pulsed RF power, which forms the etch phase gas into a plasma, and stopping the etch phase.

18 Claims, 7 Drawing Sheets

US 10,002,773 B2

METHOD FOR SELECTIVELY ETCHING SILICON OXIDE WITH RESPECT TO AN ORGANIC MASK

BACKGROUND

The disclosure relates to a method of forming semiconductor devices on a semiconductor wafer. More specifically, the disclosure relates to etching features in a dielectric layer.

In forming semiconductor devices, etch layers may be etched to form dual damascene features. A via first process etches vias first and then trenches.

SUMMARY

To achieve the foregoing and in accordance with the purpose of the present disclosure, a method for selectively etching trenches in a silicon oxide containing layer with an organic planarization layer with via plugs is provided. The silicon oxide containing layer is placed in a processing chamber. Processing the silicon oxide layer comprises a plurality of process cycles, wherein each etch cycle comprises a deposition phase, comprising providing a flow of a deposition phase gas into the processing chamber comprising a fluorocarbon or hydrofluorocarbon containing gas with a fluorine to carbon ratio, providing a constant RF power with a RF frequency of at least 60 MHz, which forms the deposition phase gas into a plasma, and stopping the deposition phase, by stopping the flow of the deposition phase gas into the processing chamber and an etch phase, comprising providing a flow of an etch phase gas into the processing chamber comprising a fluorocarbon or hydrofluorocarbon containing gas with a fluorine to carbon ratio that is higher than the fluorine to carbon ratio of the deposition phase gas, providing a pulsed RF power with a RF frequency of at least 60 MHz, which forms the etch phase gas into a plasma, and stopping the etch phase, by stopping the flow of the etch phase gas into the processing chamber.

These and other features of the present invention will be described in more details below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
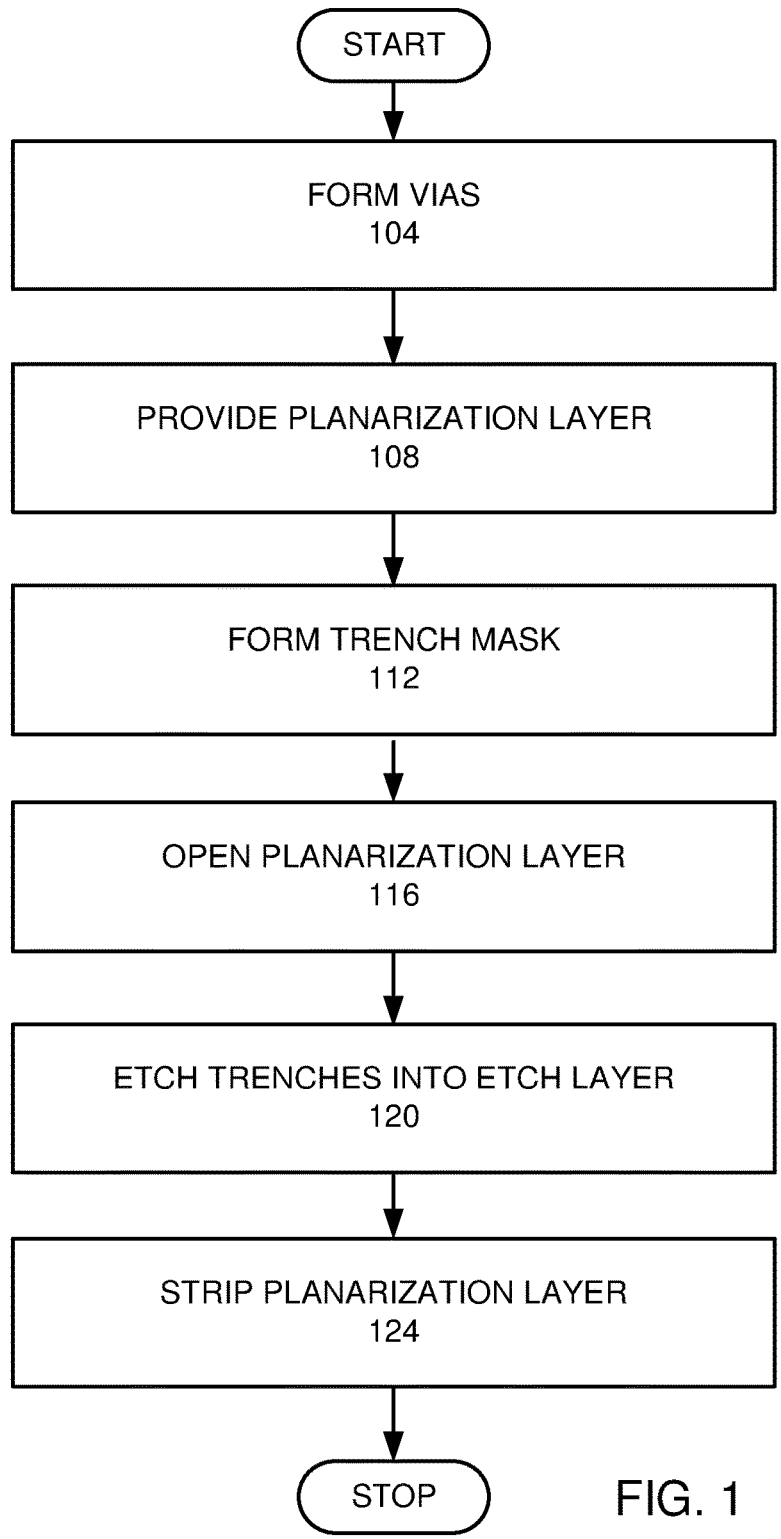
FIG. 1 is a high level flow chart of an embodiment.
Figure 2:
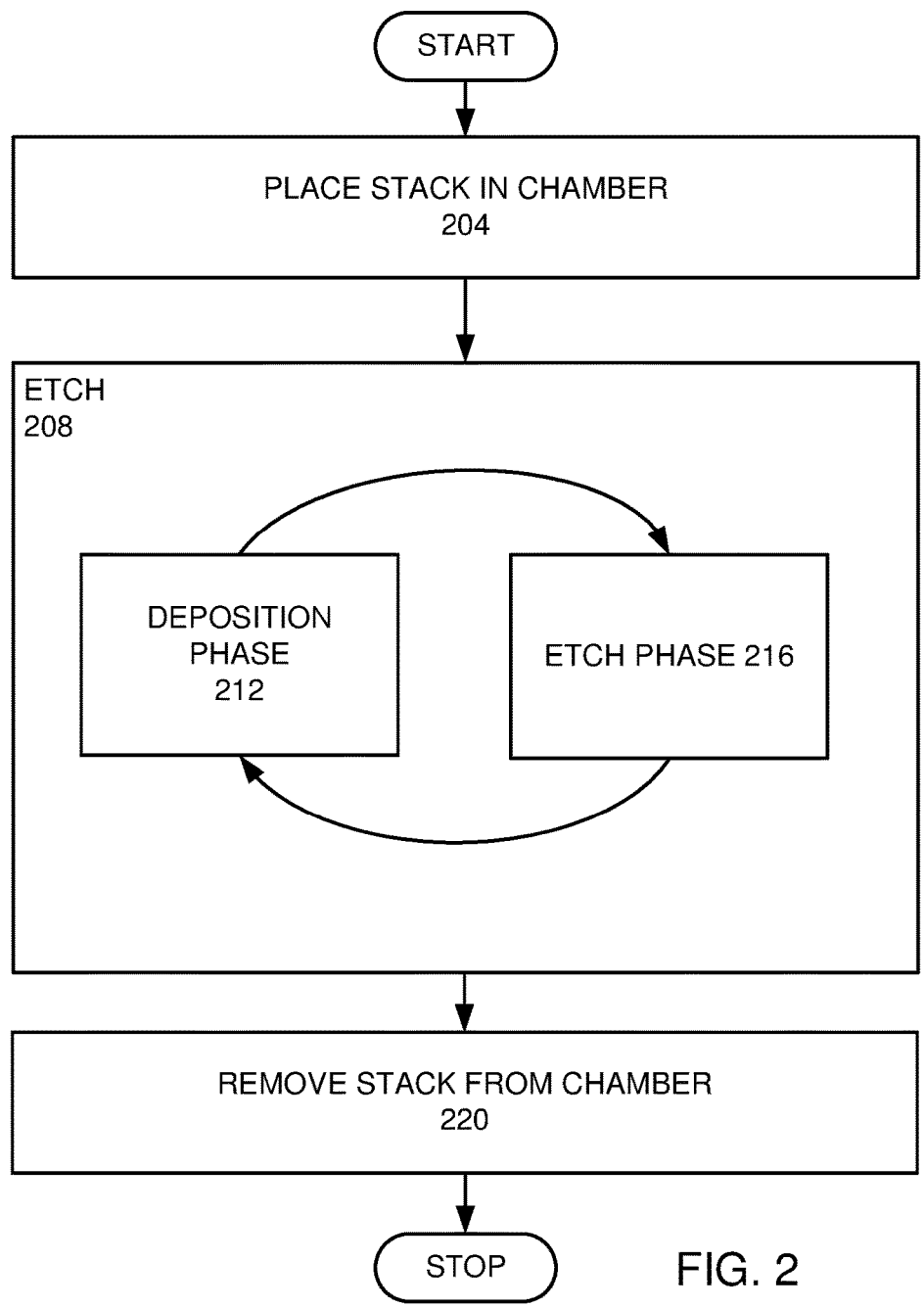
FIG. 2 is a more detailed flow chart of the step of etching trenches.

FIG. 1 is a high level flow chart of an embodiment. In this embodiment, vias are formed in an etch layer (step 104). A planarization layer is formed over the etch layer, which forms via plugs in the vias (step 108). A trench mask is formed over the planarization layer (step 112). The planarization layer is opened (step 116). Trenches are etched into the etch layer (step 120). FIG. 2 is a more detailed flow chart of the step of etching trenches into the etch layer. A stack with the etch layer is placed into a plasma processing chamber (step 204). An etch process is provided (step 208), where the etch process comprises a plurality of cycles, where each cycle comprises a deposition phase (step 212) and an etch phase (step 216). After the etch process is completed the stack is removed from the chamber (step 220). The planarization layer is stripped (step 124). In various embodiments, the planarization layer may be opened after placing the stack in the chamber and the planarization layer may be stripped before removing the stack from the chamber.

Example

Figure 3A:
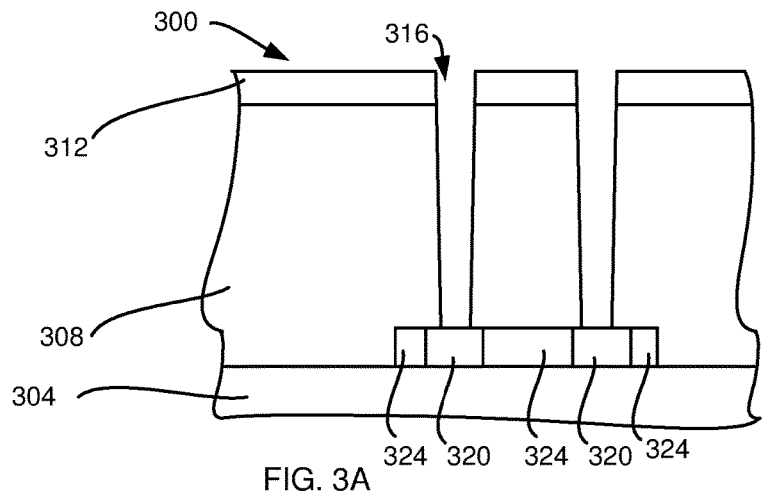
FIGS. 3A-E are schematic cross-sectional views of a stack processed according to an embodiment.

In a preferred embodiment of the invention, vias are formed in an etch layer (step 104). FIG. 3A is a schematic cross-sectional view of a stack 300 with a substrate 304 with a silicon oxide containing etch layer 308 disposed below a via patterned mask 312. In this example, one or more layers may be disposed between the substrate 304 and the silicon oxide containing etch layer 308, or the silicon oxide containing etch layer 308 and the via patterned mask 312. The via patterned mask 312 has been used to selectively etch vias 316 to interlayer contacts 320 below the silicon oxide etch layer 308. The interlayer contacts 320 are conductive contacts that may be placed within another dielectric layer 324. The via patterned mask 312 may be removed during the etching of the vias 316, but are shown here for clarification. If the vias patterned mask 312 remains after etching vias 316, the via patterned mask 312 may be subsequently removed.

Figure 3B:
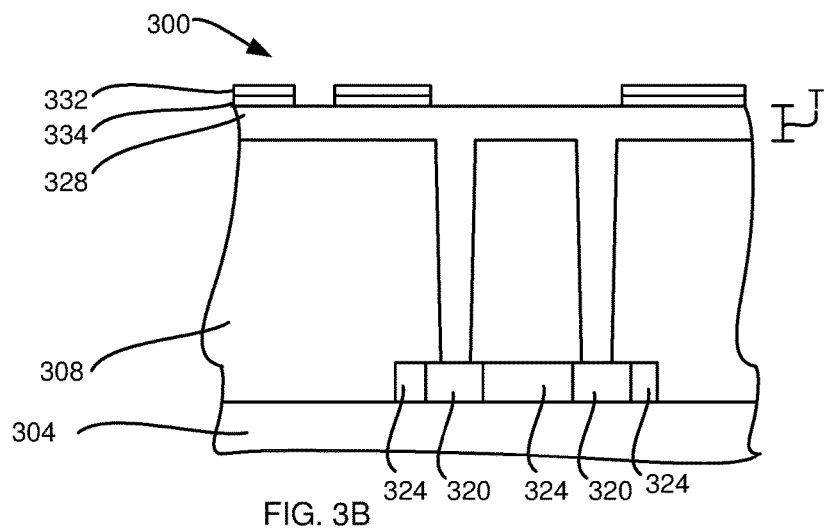

A planarization layer is provided (step 108). Preferably, the planarization layer is an organic material such as spin-on-carbon, amorphous carbon (ACL), an optical dispersive layer (ODL), or a spin-on organic hardmask (SOH). In this example, the planarization layer is spin-on carbon. A trench mask is formed over the planarization layer (step 112). In this example, the trench mask is an extreme ultra violet (EUV) mask. Since the trench mask is an EUV mask, the thickness of the planarization layer over the top of the silicon oxide etch layer 308 is preferably less than 100 nm. FIG. 3B is a schematic cross-sectional view of the stack 300 after the formation of the planarization layer 328 and the EUV trench mask 332. A silicon containing antireflective coating (SiARC) 334, is between the EUV trench mask 332 and the planarization layer 328, and is used for patterning the EUV trench mask 332. The thickness of the planarization layer is designated as "T".

Figure 3C:
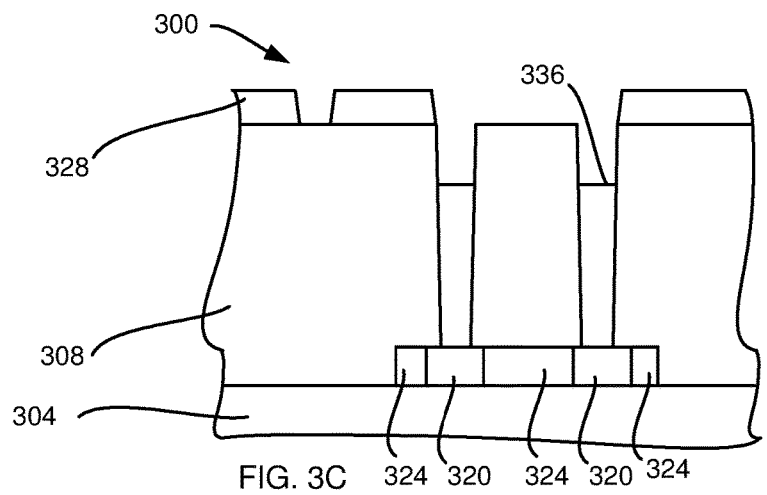

The planarization layer is opened (step 116). The planarization layer 328 is selectively etched with respect to the EUV mask 332 and/or the SiARC 334. An example of a recipe for opening the planarization layer provides a planarization gas of 900 sccm $H_2$ and 750 sccm $N_2$. 600 watts at 60 MHz is provided to form the planarization gas into a plasma. FIG. 3C is a schematic cross-sectional view of the stack 300 after the planarization layer 328 has been opened. In this example, the EUV trench mask removed during the opening of the planarization layer 328. The planarization layer 328 is thin enough to be sufficiently opened before the EUV trench mask and SiARC are removed. The part of the planarization layer that remains in the vias form vias plugs 336.

Trenches are etched into the silicon oxide containing etch layer 308 (step 120). According FIG. 2, the more detailed flow chart of etching the silicon oxide containing etch layer 308, the stack is placed in a plasma processing chamber (step 204).

Figure 4:
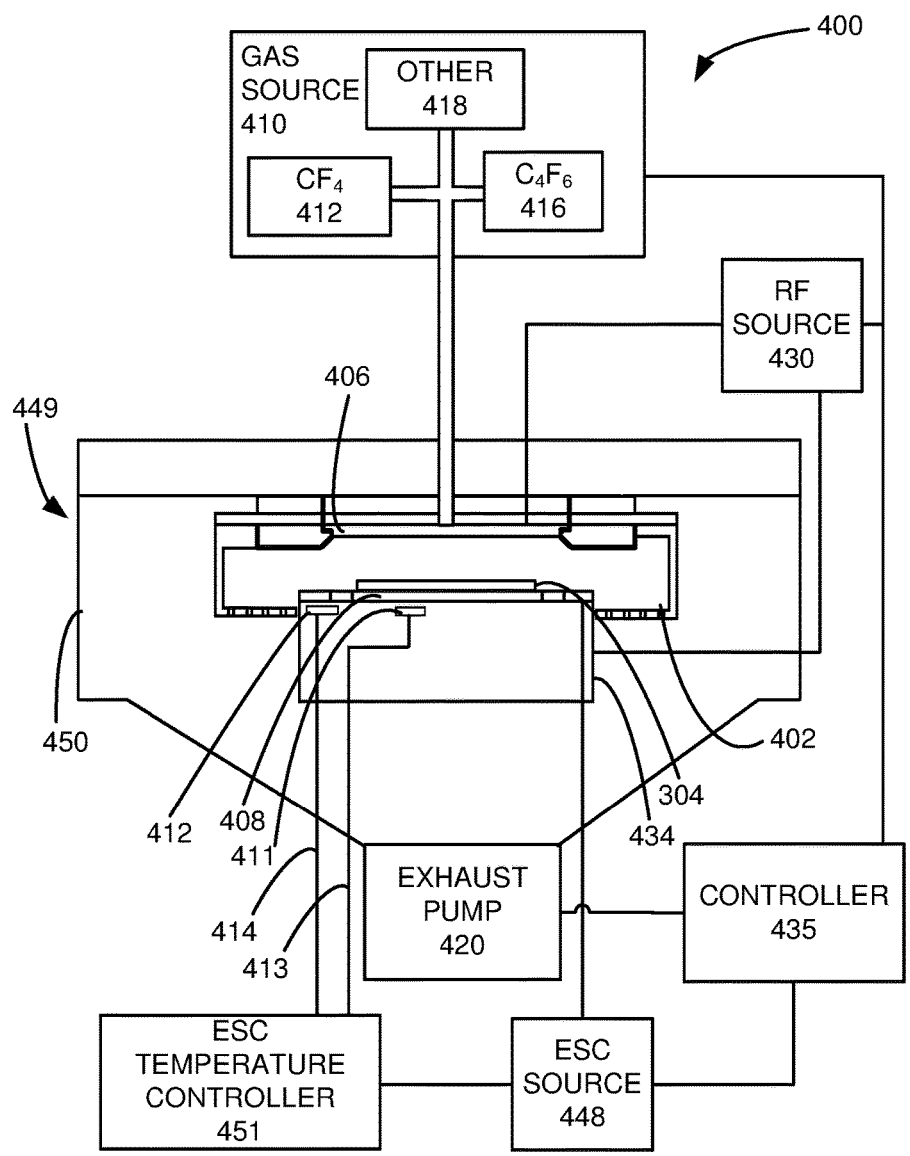
FIG. 4 is a schematic view of a plasma processing chamber that may be used in an embodiment.

FIG. 4 is a schematic view of a plasma processing chamber that may be used in an embodiment. In one or more embodiments, the plasma processing chamber 400 comprises a gas distribution plate 406 providing a gas inlet and an electrostatic chuck (ESC) 408, within a processing chamber 449, enclosed by a chamber wall 450. Within the processing chamber 449, a substrate 304 is positioned on top of the ESC 408. The ESC 408 may provide a bias from the ESC source 448. A gas source 410 is connected to the processing chamber 449 through the distribution plate 406. In this embodiment, the gas source 410 comprises a $CF_4$ gas source 412, a $C_4F_6$ gas source 416, and one or more additional gas sources 418. Each gas source may comprise multiple gas sources. An ESC temperature controller 451 is connected to the ESC 408, and provides temperature control of the ESC 408. In this example, a first connection 413 for providing power to an inner heater 411 for heating an inner zone of the ESC 408 and a second connection 414 for providing to an outer heater 412 for heating an outer zone of the ESC 408. An RF source 430 provides RF power to a lower electrode 434 and an upper electrode, which in this embodiment is the gas distribution plate 406. In a preferred embodiment, 2 MHz, 60 MHz, and optionally, 27 MHz power sources make up the RF source 430 and the ESC source 448. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments, such as in another embodiment the upper electrodes may be grounded A controller 435 is controllably connected to the RF source 430, the ESC source 448, an exhaust pump 420, and the etch gas source 410. An example of such a etch chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 5:
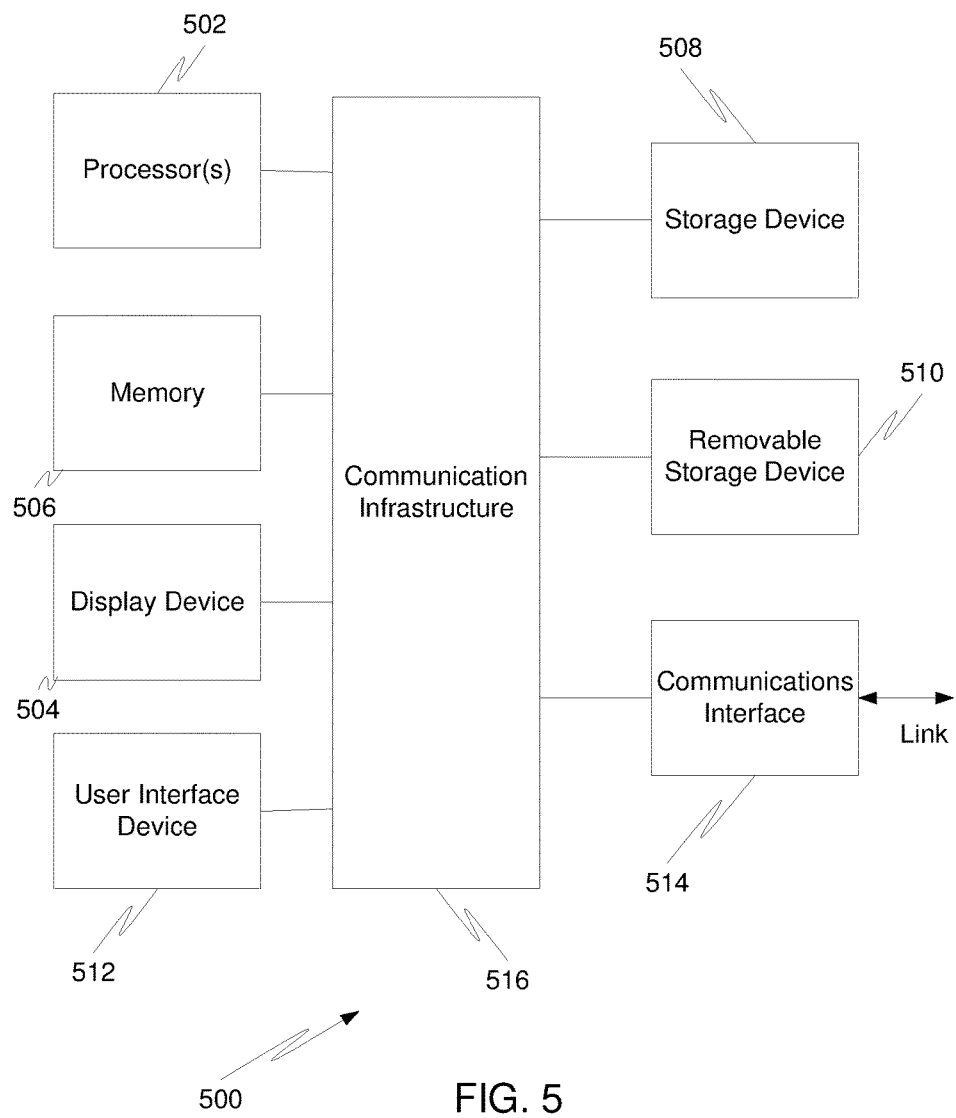
FIG. 5 is a schematic view of a computer system that may be used in practicing an embodiment.

FIG. 5 is a high level block diagram showing a computer system 500, which is suitable for implementing a controller 435 used in embodiments of the present invention. The computer system may have many physical forms ranging from an integrated circuit, a printed circuit board, and a small handheld device, up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3D:
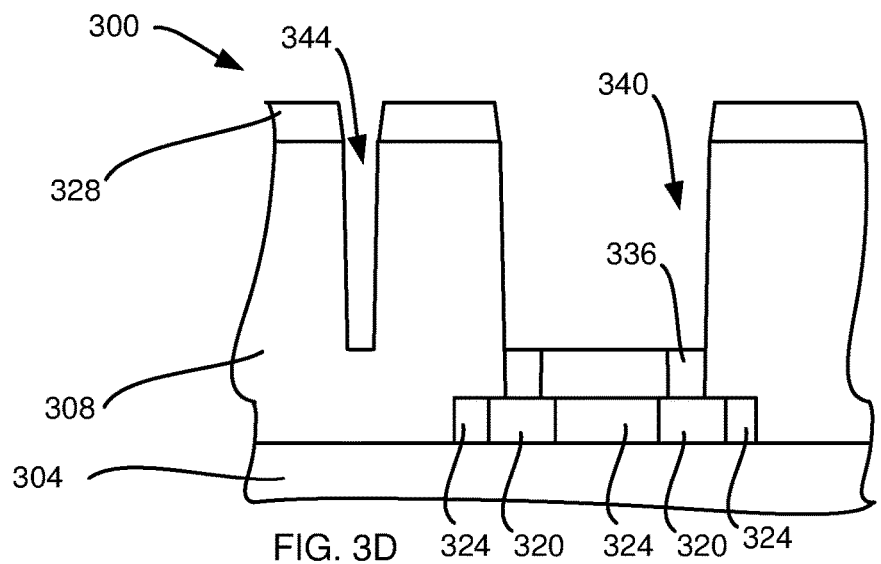

After the stack has been placed into the plasma processing chamber 400, an etch process may be provided (step 208). The etch process comprises a plurality of cycles, where each cycle comprises a deposition phase (step 212) and an etch phase (step 216). An example of a deposition phase provides a deposition phase gas comprising a fluorocarbon or hydrofluorocarbon containing gas with a fluorine to carbon ratio. In this example, a deposition phase gas of 2 sccm $C_4F_6$, 301 sccm Ar, and 40 sccm CO is flowed into the processing chamber 449. The deposition phase gas is formed into an in situ plasma. In this example, the deposition phase gas is formed into a plasma by providing a continuous RF power with an RF frequency of at least 60 MHz. In this example, 100 Watts of RF power are provided. The processing chamber 449 is maintained at a pressure of 15 mTorr. After 4 seconds, the deposition phase (step 212) is stopped. In this example, the deposition phase (step 212) is stopped by stopping the flow of deposition phase gas. An example of an etch phase provides an etch phase gas comprising a fluorocarbon or hydrofluorocarbon containing gas with a fluorine to carbon ratio that is higher than the fluorine to carbon ratio of the deposition phase gas. In this example, an etch phase gas of 100 sccm $CF_4$ and 243 sccm Ar is flowed into the processing chamber 449. The etch phase gas is formed into an in situ plasma. In this example, the etch phase gas is formed into a plasma by providing a pulsed RF power with an RF frequency of at least 60 MHz. In this example, 150 Watts of RF power are provided. In addition, 50 Watts of RF power with an RF frequency of 2 MHz is provided. In this embodiment, the duty cycle is 10%. In various embodiments, the RF duty cycle in deposition and etch phases can be varied to achieve better etch selectivity and pattern open ability. After 4 seconds, the etch phase (step 216) is stopped. In this example, the etch phase (step 216) is stopped by stopping the flow of etch phase gas. After a plurality of cycles, the etch process is stopped. The stack is removed from the plasma processing chamber (step 220). FIG. 3D is a schematic cross-sectional view of the stack 300 after the etch process is completed. A trench 340 has been etched, while the vias are protected by the via plugs 336. Other features 344 may also be etched.

Figure 3E:
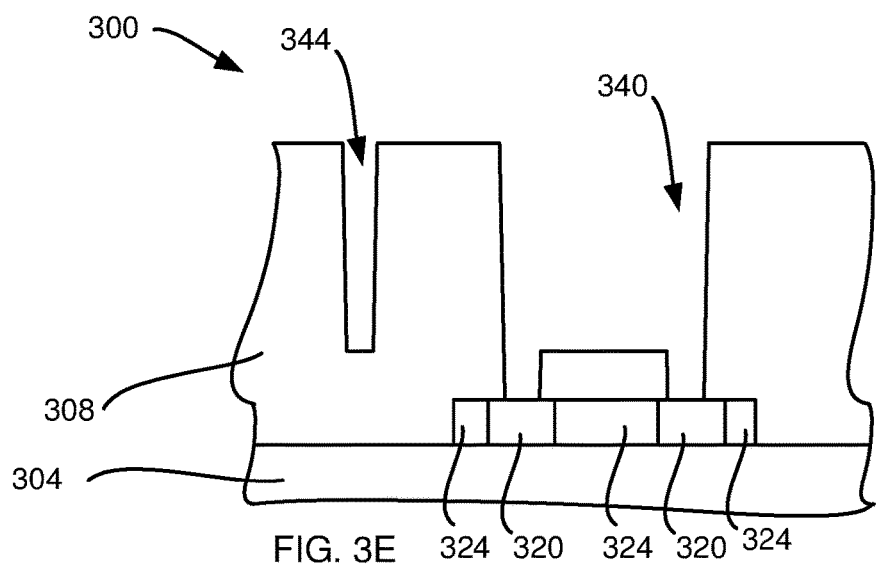

The planarization layer is stripped (step 124). An example of a recipe for stripping the planarization layer flows a stripping gas of 2000 sccm $O_2$ into the processing chamber 449. 600 Watts of RF power at 60 MHz is provided to transform the stripping gas into a plasma, which strips the remaining planarization layer. The processing chamber pressure is maintained at 450 mTorr. FIG. 3E is a schematic cross-sectional view of the stack 300 after the planarization layer has been stripped. The resulting structure causes less defects than structures formed using the prior art.

Figure 6:
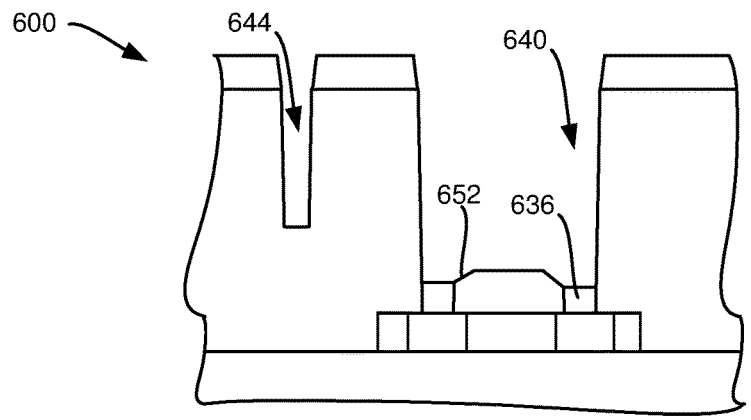
FIG. 6 is a schematic cross-sectional view of a stack processed according to the prior art.

FIG. 6 is a schematic cross-sectional view of a stack that has been processed using a prior art process. In this example, the via plugs 636 are etched too quickly, causing a chamfer 652 of the corners. This may be caused by too much etching of the via plugs during the opening of the planarization layer. In addition, the etch is aspect ratio dependent, where in this example the higher aspect ratio feature 644 with a higher height to width ratio is etched slower than the lower aspect ratio trench 640. The chamfering 652 and aspect ratio dependent etch rate increases device failure. For example, chamfering may cause leakage issues. Aspect ratio dependency may cause higher or lower contact resistance.

Figure 7A:
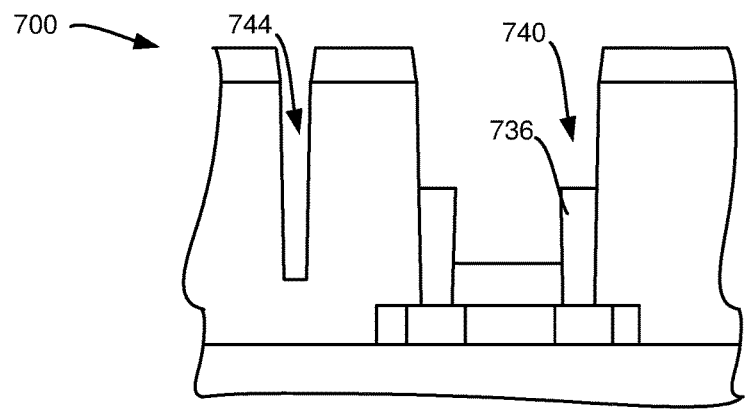
FIGS. 7A-B are schematic cross-sectional views of another stack processed according to the prior art.
Figure 7B:
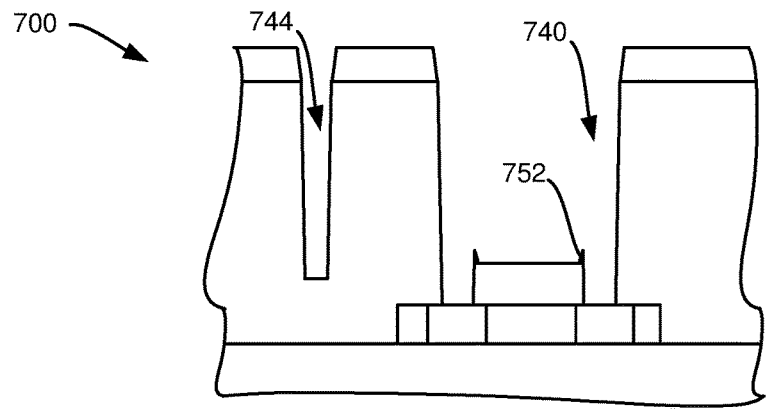

FIG. 7A is a schematic cross-sectional view of a stack that has been processed using another prior art process. In this example, the via plugs 736 are not etched as much as in the previous example during the opening of the planarization layer, in order to avoid chamfering. As a result, after the trenches are etched, the via plugs 736 have a height that is higher than the bottom of the trench 740. In addition, in this example, the etch is aspect ratio dependent, where in this example the higher aspect ratio 744 with a higher height to width ratio is etched slower than the lower aspect ratio trench 740. FIG. 7B is a schematic cross-sectional view of a stack after the via plugs have been stripped. The higher via plugs during etching causes a fence 752 to be formed. Although this process prevents chamfering, it causes the formation of the fence 752. The fence 752 and aspect ratio dependent etch rate increases device failure. For example, fencing may increase metal void formation.

Embodiments avoid chamfering, fencing, and aspect ratio dependent etching. The embodiments have been found to allow improved chamfer profile control and reduce fencing, while increasing the selectivity of the etching of the silicon oxide containing etch layer with respect to the planarization layer, which allows for a thinner planarization layer. In addition, embodiments have been found to reduce aspect ratio dependence. In the migration to small devices, more fragile and thinner resist masks, such as EUV masks, are used. More fragile and thinner masks require an increased selectivity, which is provided by embodiments. Various embodiments use organic planarization layers of less than 100 nm to selectively etch substantially pure silicon oxide. Substantially pure silicon oxide consists essentially of silicon oxide with possibly some other dopants.

Without being bound by theory, the mixed mode pulsing of the embodiments allows for a leaner chemistry, which has less polymer. It has been found that the $C_4F_6$ and CO selectively deposit on top the mask with respect to the bottoms of the etch features over a cycle. The leaner etch gas helps to remove some of the polymer deposition on the mask in order to avoid pinch off. Therefore, in some embodiments, the deposition gas comprises $C_4F_6$, while the etch gas comprises $CF_4$. More preferably, the deposition gas does not contain $CF_4$. More preferably, the etch gas does not contain $C_4F_6$. The cycling between deposition and etching allows the decoupling of mask selectivity, aspect ratio dependent lag, chamfering and fencing, allowing a reduction of aspect ratio dependent lag, chamfering, and fencing. The gas and power pulsing, as specified in the embodiments, minimizes aspect ratio dependent etching by allowing time for reactants to reach the surface and etch byproducts to be removed before another incident ion pulse causes the reaction.

In other embodiments, the deposition gas comprises polymerizing chemistries with at least one of $C_4F_6$, $C_4F_8$, $CH_2F_2$, or CO. The etch gas comprises a leaner chemistry with at least one of $CF_4$, $NF_3$, $CHF_3$, $O_2$, Ar, or $N_2$. A leaner chemistry is defined has having a higher fluorine to carbon ratio or a lower carbon to fluorine ratio. Some of the tuning controls provided by various embodiments are phase times, deposition phase gas, etch phase gas, RF power duty cycle, and RF power. In the example, the fluorine to carbon ratio of the deposition phase gas is 1:4 or 0.25:1. The fluorine to carbon ratio of the etch phase gas is 4:1. Generally, the deposition phase gas has a fluorine to carbon ratio of less than 1:1 and the etch phase gas has a fluorine to carbon ratio of greater than 1:1. In addition, the ratio of the ratio of the fluorine to carbon for the etch phase gas to the ratio of the fluorine to carbon for the deposition phase gas is greater than 2:1. In some embodiments, the deposition phase case comprises a fluorocarbon and the etch phase gas comprises a fluorocarbon.

In some embodiments, the etch phase is less than 10 seconds and the deposition phase is less than 10 seconds.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for selectively etching trenches in a silicon oxide containing layer with an organic planarization layer with via plugs, comprising:
   placing the silicon oxide containing layer in a processing chamber;
   processing the silicon oxide layer using a plurality of process cycles, wherein each process cycle comprises:
      a deposition phase, comprising:
         providing a flow of a deposition phase gas into the processing chamber, the deposition phase gas comprising a fluorocarbon or hydrofluorocarbon containing gas with a fluorine to carbon ratio;
         providing a RF power with a RF frequency of at least 60 MHz, which forms the deposition phase gas into a plasma; and
         stopping the deposition phase; and
      an etch phase, comprising:

providing a flow of an etch phase gas into the processing chamber, the etch phase gas comprising a fluorocarbon or hydrofluorocarbon containing gas with a fluorine to carbon ratio that is higher than the fluorine to carbon ratio of the deposition phase gas;

providing a pulsed RF power with a RF frequency of at least 60 MHz, which forms the etch phase gas into a plasma, wherein the pulsed RF power provided during the etch phase is greater than the RF power provided during the deposition phase; and stopping the etch phase.

2. The method, as recited in claim 1, wherein each etch phase is for a period of less than 10 seconds and wherein each deposition phase is for a period of less than 10 seconds.

3. The method, as recited in claim 2, wherein the etch phase gas comprises at least one of $CF_4$, $NF_3$, $CHF_3$, $O_2$, Ar, or $N_2$ and wherein the deposition phase gas comprises at least one of $C_4F_6$, $C_4F_8$, $CH_2F_2$, or CO.

4. The method, as recited in claim 3, wherein the organic planarization layer has a thickness of less than 100 nm.

5. The method, as recited in claim 4, wherein the organic planarization layer is under a SiARC layer, which is under an EUV mask.

6. The method, as recited in claim 5, wherein the organic planarization layer forms isolated and dense regions.

7. The method, as recited in claim 6, wherein the pulsed RF power during the etch phase is greater because the pulsed RF power with a frequency of at least 60 MHz during the etch phase is greater than a constant RF power with a RF frequency of at least 60 MHz during the deposition phase.

8. The method, as recited in claim 6, wherein the deposition phase gas has a fluorine to carbon ratio of less than 1:1 and the etch phase gas has a fluorine to carbon ratio of greater than 1:1.

9. The method, as recited in claim 1, wherein the RF power during the deposition phase is constant.

10. The method, as recited in claim 1, wherein the etch phase gas comprises at least one of $CF_4$, $NF_3$, $CHF_3$, $O_2$, Ar, or $N_2$ and wherein the deposition phase gas comprises at least one of $C_4F_6$, $C_4F_8$, $CH_2F_2$, or CO.

11. The method, as recited in claim 1, wherein the organic planarization layer has a thickness of less than 100 nm.

12. The method, as recited in claim 1, wherein the organic planarization layer is under a SiARC layer, which is under an EUV mask.

13. The method, as recited in claim 1, wherein the organic planarization layer forms isolated and dense regions.

14. The method, as recited in claim 1, wherein the pulsed RF power during the etch phase is greater because the pulsed RF power with a frequency of at least 60 MHz during the etch phase is greater than a constant RF power with a RF frequency of at least 60 MHz during the deposition phase.

15. The method, as recited in claim 1, wherein no RF power is provided at a frequency less than 60 Hz.

16. The method, as recited in claim 1, wherein an additional bias RF power is provided during the etch phase.

17. The method, as recited in claim 1, wherein the deposition phase gas has a fluorine to carbon ratio of less than 1:1 and the etch phase gas has a fluorine to carbon ratio of greater than 1:1.

18. The method, as recited in claim 1, wherein a ratio of a ratio of the fluorine to carbon for the etch phase gas to a ratio of the fluorine to carbon for the deposition phase gas is greater than 2:1.

* * * * *